(12) United States Patent
Shifren et al.

(10) Patent No.: US 10,873,025 B2
(45) Date of Patent: Dec. 22, 2020

(54) FORMATION OF CORRELATED ELECTRON MATERIAL (CEM) DEVICE VIA DOPANT DEPOSITION AND ANNEAL

(71) Applicant: Cerfe Labs, Inc., Austin, TX (US)

(72) Inventors: Lucian Shifren, San Jose, CA (US); Carlos Alberto Paz de Araujo, Colorado Springs, CO (US); Jolanta Bozena Celinska, Colorado Springs, CO (US); Christopher Randolph McWilliams, Colorado Springs, CO (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/572,521

(22) Filed: Sep. 16, 2019

(65) Prior Publication Data

US 2020/0013954 A1    Jan. 9, 2020

Related U.S. Application Data

(63) Continuation of application No. 15/939,183, filed on Mar. 28, 2018, now Pat. No. 10,418,553.

(51) Int. Cl.
*H01L 45/00* (2006.01)
*H01L 27/24* (2006.01)

(52) U.S. Cl.
CPC .......... *H01L 45/145* (2013.01); *H01L 27/249* (2013.01); *H01L 45/04* (2013.01); *H01L 45/1226* (2013.01); *H01L 45/1233* (2013.01); *H01L 45/146* (2013.01); *H01L 45/1608* (2013.01); *H01L 45/1616* (2013.01); *H01L 45/1641* (2013.01)

(58) Field of Classification Search
None
See application file for complete search history.

(56) References Cited

U.S. PATENT DOCUMENTS

| | | | |
|---|---|---|---|
| 2012/0104417 A1* | 5/2012 | Kawada | H01L 21/0485 257/77 |
| 2016/0163978 A1* | 6/2016 | Paz de Araujo | H01L 45/147 257/4 |

* cited by examiner

*Primary Examiner* — Sitaramarao S Yechuri
(74) *Attorney, Agent, or Firm* — Berkeley Law & Technology Group, LLP

(57) ABSTRACT

Subject matter disclosed herein may relate to fabrication of a correlated electron material (CEM) switch. In particular embodiments, formation of a CEM switch may comprise depositing metal layers, such layers of a transition metal, over a conductive substrate. Dopant layers may subsequently be deposited on the layers of the transition metal, followed by annealing of the layers of transition metal and dopant layers. Responsive to annealing, dopant from the dopant layers may diffuse into the one or more layers of transition metal, thereby forming a CEM.

16 Claims, 5 Drawing Sheets

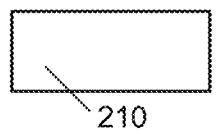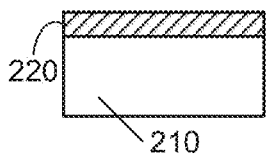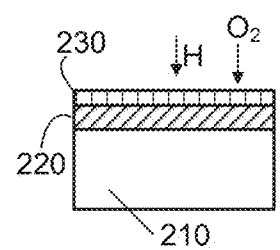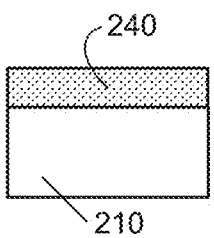
FIG. 2A    FIG. 2B    FIG. 2C    FIG. 2D
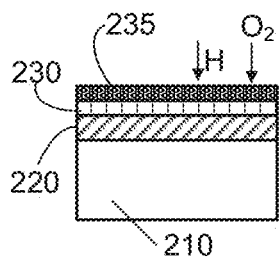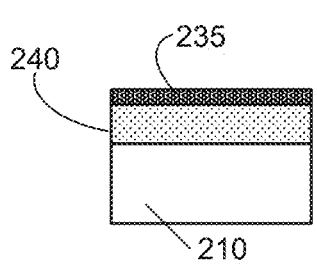
FIG. 3A    FIG. 3B

800

- 810: Deposit, in a chamber, one or more layers of a first material, having an atomic concentration of a first transition metal of at least about 90.0%, over a conductive substrate
- 820: Deposit one or more layers of a second material, comprising an atomic concentration of carbon of at least 90.0%, over the one or more layers of the first material
- 830: Anneal the one or more layers of the second material deposited over the one or more layers of the first material, in an oxygen-containing environment, the annealing to diffuse carbon and oxygen into the one or more layers of the first material to form a first CEM

- 910: Deposit, in a chamber, one or more layers of a first material, having an atomic concentration of a first transition metal of at least about 90.0%, over a conductive substrate
- 920: Form one or more voids in the one or more layers of the first material
- 930: Deposit one or more layers of a second material, having an atomic concentration of carbon of at least about 90.0%, on the one or more layers of the first material
- 940: Anneal the one or more layers of the second material, deposited on the one or more layers of the first material, in an oxygen-containing environment, the annealing to diffuse carbon and oxygen into the one or more layers of the first material to form a CEM

*FIG. 9*

FORMATION OF CORRELATED ELECTRON MATERIAL (CEM) DEVICE VIA DOPANT DEPOSITION AND ANNEAL

RELATED APPLICATIONS

This application is a continuation of U.S. patent application Ser. No. 15/939,183 entitled "FORMATION OF CORRELATED ELECTRON MATERIAL (CEM) DEVICE VIA DOPANT DEPOSITION AND ANNEAL," filed Mar. 28, 2018, and is incorporated herein by reference in its entirety.

BACKGROUND

Field

This disclosure relates to devices formed from correlated electron material (CEM), and may relate, more particularly, to approaches for fabricating CEM devices, such as may be used in switches, memory circuits, and so forth, which may exhibit desirable impedance switching characteristics.

Information

Integrated circuit devices, such as electronic switching devices, for example, may be found in numerous types of electronic devices. For example, memory and/or logic devices may incorporate electronic switches suitable for use in computers, digital cameras, smart phones, computing devices, wearable electronic devices, and so forth. Factors that may relate to electronic switching devices, which may be of interest to a designer in considering whether an electronic switching device is suitable for particular applications, may include physical size, storage density, operating voltages, impedance ranges, switching speed, and/or power consumption, for example. Other factors may include, for example, cost and/or ease of manufacture, scalability, and/or reliability.

However, conventional fabrication techniques, which may be well suited for certain types of memory and/or logic devices, may not be suitable for use in fabricating correlated electron material devices that exhibit desired switching capabilities.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIGS. 2A-2D illustrate embodiments of sub-processes, which may be utilized to form a correlated electron material device via dopant deposition and anneal;

FIGS. 3A-3B illustrate a variation of the embodiments of the sub-processes of FIGS. 2A-2D illustrating deposition of a capping layer prior to anneal;

FIGS. 8-9 are flow diagrams illustrating processes of fabricating and/or constructing a CEM switching device according to embodiments.

Figure 1A:
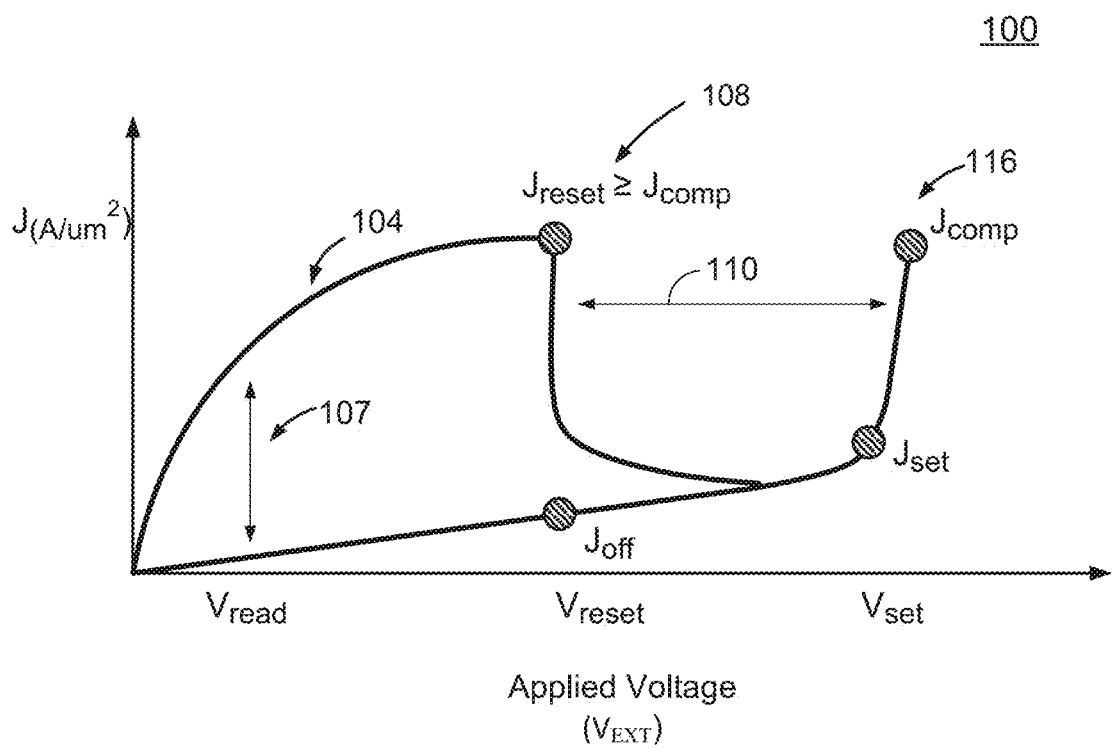
FIG. 1A is an illustration of an embodiment of a current density versus voltage profile of a device formed from a correlated electron material.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) films to form, for example, a correlated electron switch, such as may be utilized to form a correlated electron random access memory (CERAM), and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects.

In this context, a CEM switch, for example, may exhibit a substantially rapid conductor-to-insulator transition, which may be enabled, at least in part, by electron correlations, which modify electrical properties of the material, rather than solid-state structural phase changes, such as in response to a change from a crystalline to an amorphous state, for example. Such solid-state structural phase changes, such as from crystalline to amorphous states, for example, may bring about formation of conductive filaments in certain resistive RAM devices. In one aspect, a substantially rapid conductor-to-insulator transition in a CEM device may be responsive to a quantum mechanical phenomenon that takes place within the bulk of a material, in contrast to melting/solidification or localized filament formation, for example, in phase change and certain resistive RAM devices. Such quantum mechanical transitions between relatively conductive and relatively insulative states, and/or between a first impedance state and a second, dissimilar impedance state, for example, in a CEM device may be understood in any one of several aspects. As used herein, the terms "relatively conductive state," "relatively lower impedance state," and/or "metal state" may be interchangeable, and/or may, at times, be referred to as a "relatively conductive/lower-impedance state." Likewise, the terms "relatively insulative state" and "relatively higher impedance state" may be used interchangeably herein, and/or may, at times, be referred to as a "relatively insulative/higher impedance state." Further, in a relatively insulative/higher-impedance state, a CEM may be characterized by a range of impedances, and, in a relatively conductive/lower-impedance state, a CEM may be characterized by a second range of impedances. In embodiments, the range of impedances may be significantly dissimilar to the second range of impedances.

In an aspect, a quantum mechanical transition of a CEM between a relatively insulative/higher impedance state and a relatively conductive/lower impedance state, wherein the relatively conductive/lower impedance state is substantially dissimilar from the insulative/higher impedance state, may be understood in terms of a Mott transition. In accordance with a Mott transition, a material may switch between a relatively insulative/higher impedance state to a relatively conductive/lower impedance state if a Mott transition condition occurs. The Mott criteria may be defined by $(n_c)^{1/3}$ a≈0.26, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers may split the bands of the CEM to bring about a relatively insulative (relatively higher impedance) state. If electrons are no longer localized, a weak coulomb interaction may dominate, which may give rise to a removal of band splitting, which may, in turn, enable a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may enable a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a CEM-based device. In an embodiment, a CEM may form a "bulk switch." As used herein, the term "bulk switch" refers to at least a substantial volume of a CEM switching a device's impedance state, such as in response to a Mott-transition. For example, in an embodiment, substantially all CEM of a device may switch between a relatively insulative/higher impedance state and a relatively conductive/lower impedance state (e.g., a "metal" or "metallic state") responsive to a Mott transition, or from a relatively conductive/lower impedance state to a relatively insulative/higher impedance state responsive to a reverse Mott transition.

In implementations, a CEM may comprise one or more "d-block" elements or compounds of "d-block" elements, which correspond to transition metals or transition metal oxides (TMOs). CEM devices may also be implemented utilizing one or more "f-block" elements or compounds of "f-block" elements. A CEM may comprise one or more rare earth elements, oxides of rare earth elements, oxides comprising one or more rare earth transition metals, perovskites, yttrium, and/or ytterbium, or any other compounds comprising metals from the lanthanide or actinide series of the periodic table of the elements, for example, and claimed subject matter is not limited in scope in this respect. A CEM may additionally comprise a dopant, such as a carbon-containing dopant and/or a nitrogen-containing dopant, wherein the atomic concentration (e.g., of carbon or nitrogen) comprise between about 0.1% to about 15.0%. As the term is used herein, a "d-block" element means an element comprising scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg), rutherfordium (Rf), dubnium (Db), seaborgium (Sg), bohrium (Bh), hassium (Hs), meitnerium (Mt), darmstadtium (Ds), roentgenium (Rg) or copernicium (Cn), or any combination thereof. A CEM formed from or comprising an "f-block" element of the periodic table of the elements means a CEM comprising a metal or metal oxide, wherein the metal is from the f-block of the periodic table of the elements, which may include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), neptunium (Np), plutonium (Pu), americium (Am), berkelium (Bk), californium (Cf), einsteinium (Es), fermium (Fm), mendelevium (Md), nobelium (No) or lawrencium (Lr), or any combination thereof.

FIG. 1A is an illustration of an embodiment 100 of a current density (J) versus an applied voltage ($V_{EXT}$) for a device formed from a CEM. Based, at least in part, on a voltage applied to terminals of a CEM device, for example, during a "write operation," the CEM device may be placed into a relatively low-impedance/conductive state or a relatively high-impedance/insulative state. For example, application of a voltage $V_{set}$ and a current density $J_{set}$ may enable a transition of the CEM device to a relatively low-impedance/conductive state. Conversely, application of a voltage $V_{reset}$ and a current density $J_{reset}$ may enable a transition of the CEM device to a relatively high-impedance/insulative state. As shown in FIG. 1A, reference designator 110 illustrates the voltage range that may separate $V_{set}$ from $V_{reset}$. Following placement of the CEM device into a high-impedance state/insulative or into a low-impedance/conductive state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1A may comprise any transition metal oxide (TMO), such as, for example, perovskites, Mott insulators, charge exchange insulators, and Anderson disorder insulators, as well as any compound or material comprising a d-block or f-block element. In one aspect, the CEM device of FIG. 1A may comprise other types of TMO switching materials, though it should be understood that these are exemplary only and are not intended to limit claimed subject matter. Nickel oxide (NiO) is disclosed as one particular TMO material. NiO materials discussed herein may be doped with substitutional ligands, such as carbon-containing materials (e.g., carbonyl $(CO)_4$), or nitrogen-containing materials, such as ammonia ($NH_3$), for example, which may establish and/or stabilize material properties and/or enable a P-type operation in which a CEM may be more conductive when placed into a low-impedance/conductive state. Thus, in another particular example, NiO doped with substitutional ligands may be expressed as NiO:$L_x$, where $L_x$ may indicate a ligand element or compound and x may indicate a number of units of the ligand for one unit of NiO. A value of x may be determined for any specific ligand and any specific combination of ligand with NiO or with any other transition metal compound by balancing valences. Other dopant ligands, which may enable or increase conductivity in a low-impedance/conductive state in addition to carbonyl may include: nitrosyl (NO), an isocyanide (RNC wherein R is H, $C_1$-$C_6$ alkyl or $C_6$-$C_{10}$ aryl), a phosphine ($R_3P$ wherein R is $C_1$-$C_6$ alkyl or $C_6$-$C_{10}$ aryl) for example, triphenylphosphine ($PPh_3$), an alkyne (e.g., ethyne) or phenanthroline ($C_{12}H_8N_2$), bipyridine ($C_{10}H_8N_2$), ethylenediamine ($C_2H_4$($NH_2$)$_2$), acetonitrile ($CH_3CN$), fluoride (F), chloride (Cl), bromide (Br), cyanide (CN), sulfur (S), carbon (C), and others.

In this context, a "P-type" doped CEM as referred to herein means a first type of CEM comprising a particular molecular dopant that exhibits increased electrical conductivity, relative to an undoped CEM, when the CEM is operated in a relatively low-impedance/conductive state. Introduction of a substitutional ligand, such as CO and $NH_3$, may operate to enhance the P-type nature of a NiO-based CEM, for example. Accordingly, an attribute of P-type operation of a CEM may include, at least in particular embodiments, an ability to tailor or customize electrical conductivity of a CEM, operated in a relatively low-impedance/conductive state, by controlling an atomic concentration of a P-type dopant in a CEM. In particular embodiments, an increased atomic concentration of a P-type dopant may enable increased electrical conductivity of a CEM, although claimed subject matter is not limited in this respect. In particular embodiments, changes in atomic concentration or atomic percentage of P-type dopant in a CEM device may be observed in the characteristics of region 104 of FIG. 1A, as described herein, wherein an increase in P-type dopant brings about a steeper (e.g., more positive) slope of region 104 to indicate higher conductivity.

In this context, a "P-type" doped CEM as referred to herein means a first type of CEM comprising a particular molecular dopant that exhibits increased electrical conductivity, relative to an undoped CEM, while the CEM is operated in a relatively low-impedance/conductive state. Introduction of a substitutional ligand, such as CO and $NH_3$, may operate to enhance the P-type nature of a NiO-based CEM, for example. Accordingly, an attribute of P-type operation of a CEM may include, at least in particular embodiments, an ability to tailor or customize electrical conductivity of a CEM, operated in a relatively low-impedance/conductive state, by controlling an atomic concentration of a P-type dopant in a CEM. In particular embodiments, an increased atomic concentration of a P-type dopant may enable increased electrical conductivity of a CEM, although claimed subject matter is not limited in this respect. In particular embodiments, changes in atomic concentration or atomic percentage of P-type dopant in a CEM device may be observed in the characteristics of region 104 of FIG. 1A, as described herein, wherein an increase in P-type dopant brings about a steeper (e.g., more positive) slope of region 104 to indicate higher conductivity.

In another embodiment, the CEM device represented by the current density versus voltage profile of FIG. 1A, may comprise other TMO materials, such as carbon-containing ligands or nitrogen-containing ligands, though it should be understood that these are exemplary only and are not intended to limit claimed subject matter. NiO, for example, may be doped with substitutional carbon- or nitrogen-containing ligands, which may stabilize switching properties in a manner similar to stabilization switching properties brought about by use of a carbon-containing dopant species (e.g., carbonyl). In particular, NiO materials disclosed herein may include nitrogen-containing molecules of the form $C_xH_yN_z$ (wherein x≥0, y≥0, z≥0, and wherein at least x, y, or z comprise values>0) such as ammonia ($NH_3$), cyano (CN), azide ion ($N_3$) ethylene diamine ($C_2H_8N_2$), phen(1,10-phenanthroline) ($C_{12}H_8N_2$), 2,2'bipyridine ($C_{10}H_8N_2$), ethylenediamine (($C_2H_4(NH_2)_2$)), pyridine ($C_5H_5N$), acetonitrile ($CH_3CN$), and cyanosulfanides such as thiocyanate ($NCS^-$), for example. NiO switching materials disclosed herein may include members of an oxynitride family ($N_xO_y$, wherein x and y comprise whole numbers, and wherein x≥0 and y≥0 and at least x or y comprise values>0), which may include, for example, nitric oxide (NO), nitrous oxide ($N_2O$), nitrogen dioxide ($NO_2$), or precursors with an $NO_3^-$ ligand.

In accordance with FIG. 1A, if sufficient bias voltage is applied (e.g., exceeding a band-splitting potential) and the aforementioned Mott condition is satisfied (e.g., injected electron holes are of a population comparable to a population of electrons in a switching region, for example), a CEM device may switch between a relatively low-impedance/conductive state to a relatively high-impedance/insulative state, for example, responsive to a Mott transition. This may correspond to point 108 of the voltage versus current density profile of FIG. 1A. At, or suitably near this point, electrons are no longer screened and become localized near the metal ion. This correlation may result in a strong electron-to-electron interaction potential, which may operate to split the bands to form a relatively high-impedance/insulative material. If the CEM device comprises a relatively high-impedance/insulative state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance/conductive state. In a low-impedance/conductive state, an increase in electrons may screen incoming electrons and remove a localization of electrons, which may operate to collapse the band-splitting potential, thereby giving rise to the low-impedance/conductive state.

In accordance with particular embodiments, current in a CEM device may be controlled by an externally applied "compliance" condition, which may be determined at least partially on the basis of an applied external current, which may be limited during a write operation, for example, to place the CEM device into a relatively high-impedance/insulative state. This externally applied compliance current may, in some embodiments, also set a condition of a current density for a subsequent reset operation to place the CEM device into a relatively high-impedance/insulative state. As shown in the particular implementation of FIG. 1A, a voltage $V_{set}$ may be applied during a write operation to give rise to a current density $J_{comp}$, such as at point 116, to place the CEM device into a relatively low-impedance/conductive state, which may determine a compliance condition for placing the CEM device into a relatively high-impedance/insulative state in a subsequent write operation. As shown in FIG. 1A, the CEM device may be subsequently placed into a low-impedance/conductive state by application of an externally applied voltage ($V_{reset}$), which may give rise to a current density $J_{reset} \geq J_{comp}$ at a voltage referenced by 108 in FIG. 1A.

In embodiments, compliance may set a number of electrons in a CEM device that may be "captured" by holes for the Mott transition. In other words, a current applied in a write operation to place a CEM device into a relatively low-impedance/conductive memory state may determine a number of holes to be injected to the CEM device for subsequently transitioning the CEM device to a relatively high-impedance/insulative state.

As pointed out above, a reset condition may occur in response to a Mott transition at point 108. As pointed out above, such a Mott transition may give rise to a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \quad (1)$$

$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device, which may correspond to P-type operation of the CEM device. Here, injection of holes may meet a Mott transition criterion for the low-impedance/conductive state to high-impedance/insulative state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

In expression (2), $Q(V_{MI})$ corresponds to the charged injected (holes or electrons) and is a function of an applied voltage. Injection of electrons and/or holes to enable a Mott transition may occur between bands and in response to threshold voltage $V_{MI}$ and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF} V_{MI}}\right)^3$$

In expression (3), $A_{CEM}$ is a cross-sectional area of a CEM device; and $J_{reset}(V_{MI})$ may represent a current density through the CEM device to be applied to the CEM device at a threshold voltage $V_{MI}$, which may place the CEM device into a relatively high-impedance/insulative state.

According to an embodiment, a CEM device, which may be utilized to form a CEM switch, a CERAM memory device, or a variety of other electronic devices comprising one or more correlated electron materials, may be placed into a relatively low-impedance/conductive memory state, such as by transitioning from a relatively high-impedance/ insulative state, for example, via injection of a sufficient quantity of electrons to satisfy a Mott transition criteria. In transitioning a CEM device to a relatively low-impedance/ conductive state, if enough electrons are injected and the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance/conductive state.

In particular embodiments, changes in impedance states of a CEM device, may be brought about by "back-donation" of electrons of compounds comprising $Ni_xO_y$ (wherein the subscripts "x" and "y" comprise whole numbers). As the term is used herein, "back-donation" refers to a supplying of one or more electrons (e.g., increased electron density) to a transition metal, transition metal oxide, or any combination thereof (e.g., to an atomic orbital of a metal), by an adjacent molecule of a lattice structure, such as a ligand or dopant. Back-donation also refers to reversible donation of electrons (e.g., an increase electron density) from a metal atom to an unoccupied π-antibonding orbital on a ligand or dopant. Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbon-containing dopants, such as carbonyl $(CO)_4$, or a nitrogen-containing dopant species, such as ammonia $(NH_3)$, ethylene diamine $(C_2H_8N_2)$, or members of an oxynitride family $(N_xO_y)$, for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in a nickel oxide material (e.g., NiO:CO or NiO:NH$_3$), thereby permitting the nickel oxide material to switch to exhibiting a substantially dissimilar impedance property, such as a high-impedance/insulative property, during device operation.

Thus, in this context, an electron back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising a transition metal, transition metal compound, or a transition metal oxide, may exhibit low-impedance/conductive properties if the transition metal, such as nickel, for example, is placed into an oxidation state of 2+ (e.g., $Ni^{2+}$ in a material, such as NiO:CO or NiO:NH$_3$). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \quad (4)$$

Such disproportionation, in this instance, refers to formation of nickel ions as $Ni^{1+} + Ni^{3+}$ as shown in expression (4), which may bring about, for example, a relatively high-impedance/insulative state during operation of the CEM device. In an embodiment, a dopant such as a carbon-containing ligand, carbonyl (CO) or a nitrogen-containing ligand, such as an ammonia molecule (NH$_3$), may permit sharing of electrons during operation of a CEM device so as to give rise to the disproportionation reaction of expression (4), and its reversal, substantially in accordance with expression (5), below:

$$Ni^{1+} + Ni^{3+} \rightarrow 2Ni^{2+} \quad (5)$$

As previously mentioned, reversal of the disproportionation reaction, as shown in expression (5), permits nickel-based CEM to return to a relatively low-impedance/conductive state.

In embodiments, depending on a molecular concentration of NiO:CO or NiO:NH$_3$, for example, which may vary from values approximately in the range of an atomic percentage of 0.1% to 10.0%, $V_{reset}$ and $V_{set}$, as shown in FIG. 1A, may vary approximately in the range of 0.1 V to 10.0 V subject to the condition that $V_{set} \geq V_{reset}$. For example, in one possible embodiment, $V_{reset}$ may occur at a voltage approximately in the range of about 0.1 V to about 1.0 V, and $V_{set}$ may occur at a voltage approximately in the range of about 1.0 V to about 2.0 V, for example. It should be noted, however, that variations in $V_{set}$ and $V_{reset}$ may occur based, at least in part, on a variety of factors, such as atomic concentration of an electron back-donating material, such as NiO:CO or NiO:NH$_3$ and other materials present in the CEM device, as well as other process variations, and claimed subject matter is not limited in this respect.

Figure 1B:
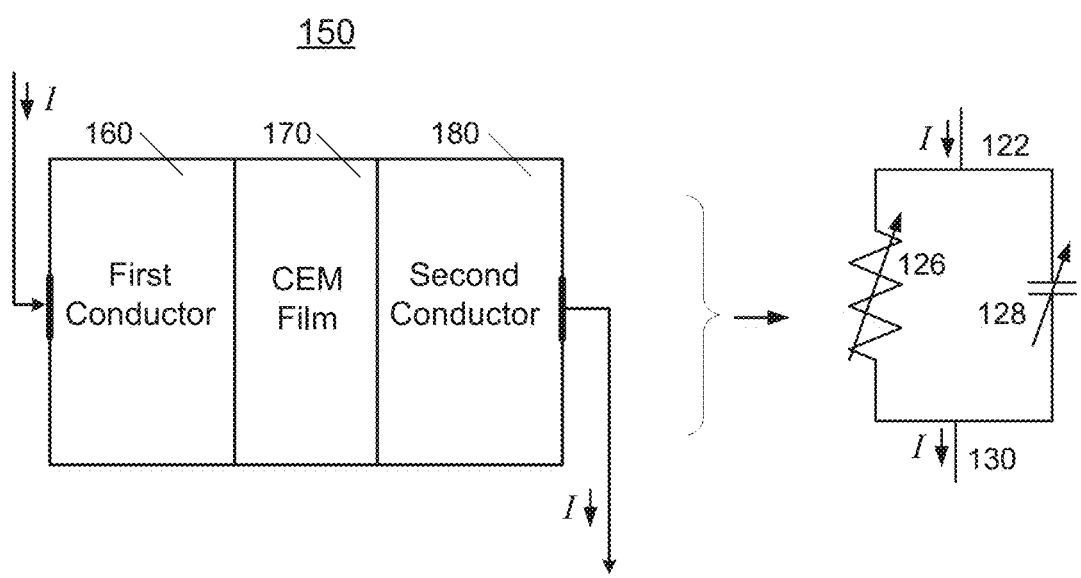
FIG. 1B is an illustration of an embodiment of a switching device comprising a correlated electron material and a schematic diagram of an equivalent circuit of a correlated electron material switch.

FIG. 1B is an illustration of an embodiment 150 of a switching device comprising a correlated electron material and a schematic diagram of an equivalent circuit of a correlated electron material switch. As previously mentioned, a correlated electron device, such as a CEM switch, a CERAM array, or other type of device utilizing one or more correlated electron materials may comprise a variable or complex impedance device that may exhibit characteristics of both variable resistance and variable capacitance. In other words, impedance characteristics for a CEM variable impedance device, such as a device comprising a first conductor 160, CEM film 170, and second conductor 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as device of embodiment 150, may comprise a substantially homogenous CEM film and claimed subject matter is not limited in this respect.

Table 1 below depicts an example truth table for an example variable impedance device, such as the device of embodiment 150.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, Table 1 shows that a resistance of a variable impedance device, such as the device of embodiment 150, may transition between a low-impedance/conductive state and a substantially dissimilar, high-impedance/insulative state as a function at least partially dependent on a voltage applied across a CEM device. In an embodiment, an impedance exhibited at a low-impedance/conductive state may be approximately in the range of 10.0-100,000.0 times lower than an impedance exhibited in a high-impedance/insulative state. In other embodiments, an impedance exhibited at a low-impedance/conductive state may be approximately in the range of 5.0 to 10.0 times lower than an impedance exhibited in a high-impedance/insulative state, for example. It should be noted, however, that claimed subject matter is not limited to any particular impedance ratios between high-impedance/insulative states and low-impedance/conductive states. Table 1 shows that a capacitance of a variable impedance device, such as the device of embodiment 150, may transition between a lower capacitance state, which, in an example embodiment, may comprise approximately zero (or very little) capacitance, and a higher capacitance state that is a function, at least in part, of a voltage applied across a CEM device.

In certain embodiments, atomic layer deposition may be utilized to form or to fabricate films comprising NiO materials, such as NiO:CO or NiO:NH$_3$. In this context, a "layer" as the term is used herein means a sheet or coating of material, which may be disposed on or over an underlying formation, such as a conductive or insulating substrate. For example, a layer deposited on an underlying substrate by way of an atomic layer deposition process may comprise a thickness dimension comparable to that of a single atom, which may comprise, for example, a fraction of an angstrom (e.g., 0.6 Å). However, in other embodiments, a layer may encompass a sheet or coating comprising a thickness dimension greater than that of a single atom depending, for example, on a process utilized to fabricate films comprising a CEM film. Additionally, a "layer" may be oriented horizontally (e.g. a "horizontal" layer), oriented vertically (e.g., a "vertical" layer), or may be positioned in any other orientation, such as diagonally, for example. In embodiments, a CEM film may comprise a sufficient number of layers, to permit electron back-donation during operation of a CEM device in a circuit environment, for example, to give rise to a low-impedance/conductive state. Also during operation in a circuit environment, for example, electron back-donation may be reversed so as to give rise to a substantially dissimilar impedance state, such as a high-impedance/insulative state, for example.

Also in this context, a "substrate" as used herein means a structure comprising a surface that enables materials, such as materials having particular electrical properties (e.g., conductive properties, insulative properties, etc.) to be deposited or placed on or over the substrate. For example, in a CEM-based device, a conductive substrate may operate in a manner similar to first conductor 160 to convey an electrical current to a CEM film in contact with conductive substrate 160. In another example, a substrate may operate to insulate a CEM film to prohibit electrical current flow to or from the CEM film. In one possible example of an insulating substrate, a material such as silicon nitride (SiN) may be employed to insulate components of semiconductor structures. Further, an insulating substrate may comprise other silicon-based materials such as silicon-on-insulator (SOI) or silicon-on-sapphire (SOS) technology, doped and/or undoped semiconductors, epitaxial layers of silicon supported by a base semiconductor foundation, conventional metal oxide semiconductors (CMOS), e.g., a CMOS front end with a metal back end, and/or other semiconductor structures and/or technologies, including CES devices, for example. Accordingly, claimed subject matter is intended to embrace a wide variety of conductive and insulating substrates without limitation. In particular embodiments, formation of CEM films on or over a substrate may utilize two or more precursors to deposit components of, for example, NiO:CO or NiO:NH$_3$, or other transition metal oxide, transition metal, or combination thereof, onto a conductive material such as a substrate. In an embodiment, layers of a CEM film may be deposited utilizing separate precursor molecules, AX and BY, according to expression (6A), below:

$$AX_{(gas)} + BY_{(gas)} = AB_{(solid)} + XY_{(gas)} \qquad (6A)$$

Wherein "A" of expression (6A) corresponds to a transition metal, transition metal compound, transition metal oxide, or any combination thereof. In embodiments, a transition metal oxide may comprise nickel, but may comprise other transition metals, transition metal compounds, and/or transition metal oxides, such as aluminum, cadmium, chromium, cobalt, copper, gold, iron, manganese, mercury, molybdenum, nickel palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate (YTiO$_3$).

In embodiments, "X" of expression (6A) may comprise a ligand, such as organic ligand, comprising amidinate (AMD), dicyclopentadienyl (Cp)$_2$, diethylcyclopentadienyl (EtCp)$_2$, Bis(2,2,6,6-tetramethylheptane-3,5-dionato) ((thd)$_2$), acetylacetonate (acac), bis(methylcyclopentadienyl) ((CH$_3$C$_5$H$_4$)$_2$), dimethylglyoximate (dmg)$_2$, 2-amino-pent-2-en-4-onato (apo)$_2$, (dmamb)$_2$ where dmamb=1-dimethylamino-2-methyl-2-butanolate, (dmamp)2 where dmamp=1-dimethylamino-2-methyl-2-propanolate, Bis (pentamethylcyclopentadienyl) (C$_5$(CH$_3$)$_5$O$_2$ and carbonyl (CO)$_4$. Accordingly, in some embodiments, nickel-based precursor AX may comprise, for example, nickel amidinate (Ni(AMD)), nickel dicyclopentadienyl (Ni(Cp)$_2$), nickel diethylcyclopentadienyl (Ni(EtCp)$_2$), Bis(2,2,6,6-tetramethylheptane-3,5-dionato)Ni(II) (Ni(thd)$_2$), nickel acetylacetonate (Ni(acac)$_2$), bis(methylcyclopentadienyl)nikel (Ni(CH$_3$C$_5$H$_4$)$_2$, Nickel dimethylglyoximate (Ni(dmg)$_2$), nickel 2-amino-pent-2-en-4-onato (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate, Bis(pentamethylcyclopentadienyl) nickel (Ni (C$_5$(CH$_3$)$_5$)$_2$, and nickel carbonyl (Ni(CO)$_4$), just to name a few examples. However, in particular embodiments, a dopant operating as an electron back-donating species in addition to precursors AX and BY may be utilized to form layers of a TMO film. An electron back-donating species, which may co-flow with precursor AX, may permit formation of electron back-donating compounds, substantially in accordance with expression (6B), below. In embodiments, a dopant species or a precursor to a dopant species, such as carbonyl $(CO)_4$, ammonia $(NH_3)$, methane $(CH_4)$, carbon monoxide (CO), or other precursors and/or dopant species may be utilized to provide electron back-donating ligands listed above. Thus, expression (6A) may be modified to include an additional dopant ligand comprising an electron back-donating material substantially in accordance with expression (6B), below:

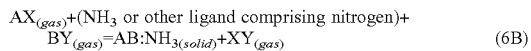

$$AX_{(gas)} + (NH_3 \text{ or other ligand comprising nitrogen}) + BY_{(gas)} = AB:NH_{3(solid)} + XY_{(gas)} \quad (6B)$$

It should be noted that concentrations, such as atomic concentrations, of precursors, such as AX, BY, and $NH_3$ (or other ligand comprising nitrogen) of expressions (6A) and (6B) may be adjusted to give rise to a final atomic concentration of nitrogen-containing or carbon-containing dopant to permit electron back-donation in a fabricated CEM device. As referred to herein, the term "dopant atomic concentration" means the concentration of atoms in the finished material that derive from the substitutional ligand. For example, in the case in which the substitutional ligand is CO, the atomic concentration of CO in percentage terms comprises the total number of carbon atoms that comprise the material film divided by the total number of atoms in the material film, multiplied by 100.0. In another example, for the case in which the substitutional ligand is $NH_3$, the atomic concentration of $NH_3$ comprises the total number of nitrogen atoms that comprise the material film divided by the total number of atoms in the material film, multiplied by 100.0.

In particular embodiments, nitrogen- or carbon-containing dopants may comprise ammonia $(NH_3)$, carbon monoxide (CO), or carbonyl $(CO)_4$ in an atomic concentration of between approximately 0.1% and 15.0%. In particular embodiments, atomic concentrations of dopants, such as $NH_3$ and CO, may comprise a more limited range of atomic concentrations such as, for example, between approximately 1.0% and 10.0%. However, claimed subject matter is not necessarily limited to the above-identified precursors and/or atomic concentrations. It should be noted that claimed subject matter is intended to embrace all such precursors and atomic concentrations of dopants utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices from TMO materials. In expressions (6A) and (6B), "BY" may comprise an oxidizer, such as water $(H_2O)$, oxygen $(O_2)$, ozone $(O_3)$, plasma $O_2$, hydrogen peroxide $(H_2O_2)$. In other embodiments, "BY" may comprise CO, $O_2+(CH_4)$, or nitric oxide (NO)+water $(H_2O)$ or an oxynitride or carbon-containing a gaseous oxidizing or oxynitridizing agent. In other embodiments, plasma may be used with an oxidizer (BY) to form oxygen radicals (O*). Likewise, plasma may be used with a dopant species to form an activated species to control dopant concentration in a CEM.

In particular embodiments, such as embodiments utilizing atomic layer deposition, a substrate, such as a conductive substrate, may be exposed to precursors, such as AX and BY of expression (6B), as well as dopants providing electron back-donation (such as ammonia or other ligands comprising metal-nitrogen bonds, including, for example, nickel-amides, nickel-imides, nickel-amidinates, or combinations thereof) in a heated chamber, which may attain, for example, a temperature of approximately in the range of 20.0° C. to 1000.0° C., for example, or between temperatures approximately in the range of 20.0° C. and 500.0° C. in certain embodiments. In one particular embodiment, in which atomic layer deposition of $NiO:NH_3$, for example, is performed, chamber temperature ranges approximately in the range of 20.0° C. and 400.0° C. may be utilized. Responsive to exposure to precursor gases (e.g., AX, BY, $NH_3$, or other ligand comprising nitrogen), such gases may be purged from the heated chamber for durations approximately in the range of 0.5 seconds to 180.0 seconds, for example. It should be noted, however, that these are merely examples of potentially suitable ranges of chamber temperature and/or time and claimed subject matter is not limited in this respect.

In certain embodiments, a single two-precursor cycle (e.g., AX and BY, as described with reference to expression (6A) or a single three-precursor cycle (e.g., AX, $NH_3$, $CH_4$, or other ligand comprising nitrogen, carbon, or other electron back-donating dopant derived from an substitutional ligand and BY, as described with reference to expression (6B) utilizing atomic layer deposition may bring about a layer of a TMO material film comprising a thickness dimension approximately in the range of 0.6 Å to 5.0 Å per cycle). Accordingly, in one embodiment, if an atomic layer deposition process is capable of depositing layers of a TMO material film comprising a thickness dimension of approximately 0.6 Å, 800-900 two-precursor cycles may be utilized to bring about a TMO material film comprising a thickness dimension of approximately 500.0 Å. It should be noted that atomic layer deposition may be utilized to form TMO material films having other thickness dimensions, such as thickness dimensions approximately in the range of about 15 Å to about 1500 Å, for example, and claimed subject matter is not limited in this respect.

In particular embodiments, responsive to one or more two-precursor cycles (e.g., AX and BY), or three-precursor cycles (AX, $NH_3$, $CH_4$, or other ligand comprising nitrogen, carbon or other back-donating dopant material and BY), of atomic layer deposition, a TMO material film may be exposed to elevated temperatures, which may, at least in part, enable formation of a CEM device from a TMO material film. Exposure of the TMO material film to an elevated temperature may additionally enable activation of a back-donating dopant derived from a substitutional ligand, such as in the form of carbon monoxide, carbonyl, or ammonia, responsive to repositioning of the dopant to metal oxide lattice structures of the CEM device film.

Thus, in this context, an "elevated temperature" means a temperature at which substitutional or substitutional ligands evaporate from a TMO material film, and/or are repositioned within a TMO material film, to such an extent that the TMO material film transitions from a resistive film to a film that is capable of switching between a relatively high-impedance/insulative state to a relatively low-impedance/conductive state. For example, in certain embodiments, a TMO material film exposed to an elevated temperature within a chamber of about 100.0° C. to about 800.0° C. for a duration of about 30.0 seconds to about 120.0 minutes may permit evaporation of substitutional ligands from the TMO material film so as to form a CEM film. Additionally, in certain embodiments, a TMO material film exposed to an elevated temperature within a chamber of about 100.0° C. to about 800.0° C. for a duration of about 30.0 seconds to about 120.0 minutes may permit repositioning of substitutional ligands, for example, at oxygen vacancies within a lattice structure of a metal oxide. In particular embodiments, elevated temperatures and exposure durations may comprise more narrow ranges, such as, for example, temperatures of about 200.0° C. to about 500.0° C. for about 1.0 minute to about 60.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, $V_{reset}$ may occur at a voltage approximately in the range of 0.1 V to 1.0 V, and $V_{set}$ may occur at a voltage approximately in the range of 1.0 V to 2.0 V, for example. Accordingly, electrical switching voltages operating in a range of approximately 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

In particular embodiments, two or more CEM devices may be formed within a particular layer of an integrated circuit at least in part by atomic layer deposition of a correlated electron material. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacent to first and second CEM devices, respectively.

In a further embodiment, one or more of a plurality of CEM devices may be positioned within two or more levels of an integrated circuit at one or more intersections of electrically conductive metal layers of a first level and electrically conductive metal layers of a second level, which may be positioned over the first level of conductive metal layers. In this context a "metal layer" as the term is used herein, means a conductor that routes an electrical current from a first location to a second location of a layer of a multi-level CEM switching device. For example, a conductive metal layer may transport electrical current to or from an access device located at an intersection of a conductive metal layer of first level and a conductive metal layer of the second level. In certain embodiments, fabrication of a switching device formed from a multi-level CEM device, such as devices formed utilizing conductive metal layers positioned at multiple levels of a CEM switching device may be utilized in in a CEM-based memory devices in which conductive metal layer positioned at multiple levels may facilitate an increase in bit line density, for example. Increases in bit line density may bring about more efficient and/or more highly integrated approaches toward controlling access to memory cells of CEM-based random access memory arrays, for example.

Also in this context, a "level" as the term is used herein, means a discrete surface, which a conductive metal layer may traverse, wherein the discrete surface is separated from discrete surfaces immediately above and/or immediately below, by an insulating material. For example, as described herein, a conductive metal layer traversing a first level may be separated from a conductive metal layer traversing a second level by an insulating material, such as silicon nitride. In this context, a "multi-level" switching device, as the term is used herein, means a device to perform a switching function, such as from a high-impedance/insulative state to a low-impedance state, utilizing two or more of the above-described "levels."

As described herein, responsive to depositing one or more dopant layers on or over one or more layers of a first material, such as a transition metal, a transition metal oxide, a transition metal compound or alloy, dopant concentration of a CEM may be accurately controlled. Additionally, by depositing one or more dopant layers on or over one or more layers of a first material, localized regions of CEM may comprise differing atomic concentrations of dopants so as to provide an approach toward tailoring or customizing a dopant concentration profile. Further, dopant concentration profiles within a CEM may be increased via adjusting annealing temperatures and/or annealing durations. In addition to the above-identified advantages, particular embodiments may provide an approach toward fabricating or forming a common source electrode, which may be useful in fabricating three-dimensional structures utilized for NAND flash memory. However, claimed subject matter is not limited to the above-identified advantages.

FIGS. 2A-2D illustrate embodiments of sub-processes, which may be utilized to form a CEM device via dopant deposition and anneal. In FIG. 2A, which corresponds to embodiment 200A, conductive substrate 210, for example, may comprise at least a substantial portion, such as at least 90.0%, of a titanium-based and/or titanium-containing substrate, such as titanium nitride (TiN), fabricated in layers, for example, for use in a CERAM device or other type of CEM-based device. In other embodiments, conductive substrate 210 may comprise other types of conductive materials, such as platinum, copper, aluminum, cobalt, nickel, tungsten, tungsten nitride, cobalt silicide, ruthenium oxide, chromium, gold, palladium, indium tin oxide, tantalum, silver, iridium, or any combination thereof, and claimed subject matter is not limited to any particular composition of conductive substrate material.

In embodiments, substrate 210 may be deposited utilizing any suitable process. Suitable processes may include, without limitation, physical vapor deposition (PVD), metal-organic chemical vapor deposition (MOCVD), atomic layer deposition (ALD), and so forth, and claimed subject matter is not limited in this respect. After formation of insulating substrate 210, a metal layer 220, such as one or more layers of a transition metal, for example, may be deposited on or over a surface of the insulating substrate, such as shown in FIG. 2B, which corresponds to embodiment 200B. In embodiment 200B, just to name a few examples, metal layer 220 may comprise Ni; however, in other embodiments, metal layer 220 may comprise any transition metal, transition metal oxide, and/or any other d-block or f-block element, or alloy thereof, having an atomic concentration of at least 90.0%, for example. In embodiments, if metal layer 220 is formed via an atomic layer deposition process capable of depositing layers of a TMO material film comprising a thickness dimension of approximately 0.6 Å, 800-900 two-precursor cycles may be utilized to bring about a TMO material film comprising a thickness dimension of approximately 500.0 Å. It should be noted that atomic layer deposition may be utilized to form TMO material films having other thickness dimensions, such as thickness dimensions approximately in the range of about 15 Å to about 1500 Å, for example, and claimed subject matter is not limited in this respect.

In embodiment 200C, as illustrated via FIG. 2C, a dopant layer, such as dopant layer 230, for example, may be formed on a surface of metal layer 220. In particular embodiments, dopant layer 230 may comprise carbon, for example, but may comprise any other suitable dopant, such as, for example: nitrosyl (NO), an isocyanide (RNC wherein R is H, $C_1$-$C_6$ alkyl or $C_6$-$C_{10}$ aryl), a phosphine ($R_3P$ wherein R is $C_1$-$C_6$ alkyl or $C_6$-$C_{10}$ aryl) for example, triphenylphosphine ($PPh_3$), an alkyne (e.g., ethyne) or phenanthroline ($C_{12}H_8N_2$), bipyridine ($C_{10}H_8N_2$), ethylenediamine ($C_2H_4(NH_2)_2$), acetonitrile ($CH_3CN$), fluoride (F), chloride (Cl), bromide (Br), cyanide (CN), and/or sulfur (S), and claimed subject matter is not limited in this respect.

In particular embodiments, dopant layer 230 may comprise a layer having a thickness dimension of between about 0.1 Å to about 250.0 Å, for example. In certain embodiments, a thickness dimension of dopant layer 230 may be selected based, at least in part, on a percentage of dopant, for example, that is to be diffused or otherwise transported into metal layer 220 during anneal in an oxygen-containing environment, shown by H↓ and $O_2$↓ in FIG. 2C. In this context, an oxygen-containing environment means an environment comprising at least a substantial percentage of oxygen, which may be in the form of atomic (O) or molecular oxygen ($O_2$), carbon dioxide ($CO_2$), carbon monoxide (CO), nitrous oxide (NO), nitric oxide ($N_2O$), nitrosyl (NOCl), or any other gaseous environment which may provide a source of oxygen. In embodiments for which a relatively small amount of dopant is to be diffused or otherwise transported into metal layer 220 during an anneal, dopant layer 230 may comprise a relatively small thickness dimension, such as a thickness dimension between about 0.1 Å to about 10.0 Å, for example. In such an embodiment, metal layer 220 may be capable of exhibiting properties of a CEM, such as an ability to switch between a high-impedance/insulative state and a low-impedance/conductive state utilizing a relatively small percentage of dopant, such as between 0.1% and 5.0%, for example.

In other embodiments, such as for which a relatively large amount of dopant is to be diffused or otherwise transported into metal layer 220 during an anneal, dopant layer 230 may comprise an increased thickness dimension, such as a thickness dimension of between about 25.0 Å to about 50.0 Å, for example. In such an embodiment, metal layer 220 may be capable of exhibiting properties of a CEM, such as an ability to switch between a high-impedance/insulative state and a low-impedance/conductive state utilizing a larger percentage of dopant, such as between 5.0% and 15.0%, for example. It should be noted that claimed subject matter is intended to embrace of a wide variety of thickness dimensions of dopant layers, such as dopant layer 230, which may, upon annealing, be diffused or otherwise transported into metal layer 220.

In particular embodiments, selection of a thickness dimension of dopant layer 230 may depend, at least in part, on physical size of an individual dopant components (such as dopant molecules or dopant atoms) arranged in a lattice or the type of arrangement of dopant molecules and/or atoms. For example, to construct dopant layer 230 utilizing a relatively large dopant molecule, such as ethylenediamine ($C_2H_4(NH_2)_2$), for example, dopant layer 230 may comprise a relatively large thickness dimension, such as between 250.0 Å and 500.0 Å. In another example, to construct dopant layer 230 utilizing a relatively small dopant species, such as carbon, for example, dopant layer 230 may comprise a relatively small thickness dimension, such as between 0.1 Å and 5.0 Å.

In other embodiments, a thickness dimension of dopant layer 230 may depend, at least in part, on an ability for a particular dopant species (such as dopant molecules or dopant atoms) to permeate or to diffuse into a metal layer. Thus, for example, to construct dopant layer 230 utilizing a dopant that is readily diffused into a metal layer, such as metal layer 220, dopant layer 230 may comprise a relatively small thickness dimension, such as between 0.1 Å and 5.0 Å. However, for a dopant that may not be readily diffused into metal layer 220, for example, dopant layer 230 may comprise a relatively large thickness dimension, such as between 250.0 Å and 500.0 Å.

In particular embodiments, a thickness dimension of dopant layer 230 may depend, at least in part, on an ability for a particular dopant to remain confined within a metal layer, such as metal layer 220 during annealing operations. Thus, for example, to construct dopant layer 230 utilizing a dopant that is easily evaporated during an anneal, for example, dopant layer 230 may comprise a relatively large thickness dimension, which may permit a sufficient quantity of dopant to be available for diffusion into metal layer 220. However, for dopant types that are not easily evaporated during an anneal, dopant layer 230 may comprise a relatively small thickness dimension, for example.

In certain embodiments, a thickness dimension of dopant layer 230 may depend, at least in part, on an annealing temperature and/or a duration of annealing operations. Thus, for example, to construct dopant layer 230 for exposure to significantly elevated annealing temperatures, such as temperatures of between 500.0° C. and 800.0° C. and/or for annealing durations of between about 30.0 minutes and about 60.0 minutes, which may bring about significant evaporation of a dopant, dopant layer 230 may comprise a relatively large thickness dimension. However, for relatively low annealing temperatures, such as temperatures of between 250.0° C. and 450.0° C. and/or for annealing durations of 1.0 minutes to 15.0 minutes, which may bring about only negligible evaporation of a dopant, dopant layer 230 may comprise a relatively small thickness dimension, for example.

Responsive to annealing of metal layer 220, which, at least in particular embodiments, brings about diffusion of a dopant from dopant layer 230 into metal layer 220, CEM film 240 may form as shown in FIG. 2D (embodiment 200D). CEM film 240 may comprise an atomic concentration of a dopant of between, for example, about 0.1% and about 15.0% depending, at least in part, on physical size of dopant molecules and/or dopant atoms, arrangement of dopant molecules and/or dopant atoms in a lattice, use of a capping layer to confine evaporation of a dopant (described in relation to FIG. 3A-3B), diffusion of dopants responsive to annealing, annealing temperature and/or annealing duration, and so forth. In embodiments of claimed subject matter, these parameters, and potentially many others, may be adjusted so as to attain a selected atomic concentration of CEM film 240.

FIGS. 3A-3B illustrate a variation of the embodiments of the sub-processes of FIGS. 2A-2D illustrating deposition of a capping layer prior to anneal, according to embodiments 300A and 300B. In FIG. 3A, dopant layer 230 may be deposited on metal layer 220, wherein metal layer 220 may be deposited on conductive substrate 210. In addition, capping layer 235, may be deposited on dopant layer 230, which may operate to intervene to act as a diffusion barrier that reduces evaporation of a dopants from dopant layer 230 during annealing of metal layer 220. Capping layer 235 may comprise, for example, silicon nitride, or, may comprise other material such as refractory metals, which may include a titanium alloy or other compound such as titanium/titanium nitride, tungsten, titanium/tungsten alloy, chromium, tantalum, or their alloys. In the embodiments of FIGS. 3A-3B, capping layer 235 may comprise a thickness dimension of between 25.0 Å and 250.0 Å, for example, but may comprise other thickness dimensions, such as a thickness dimension of less than 25.0 Å, or a thickness dimension greater than 250.0 Å, for example, and claimed subject matter is not limited in this respect.

In particular embodiments, as previously mentioned, a capping layer, such as capping layer 235, may be defined as a layer of material that operates to reduce evaporation of a dopant from a dopant layer, such as dopant layer 230, during thermal annealing of a metal layer, such as metal layer 220. A capping layer may additionally comprise a property of allowing certain gaseous elements and/or molecules, such as oxygen-containing molecules to pass from an ambient environment, such as an annealing chamber, into a metal layer. Accordingly, capping layer 235 may permit dopant layer 230 to comprise a smaller thickness dimension since, at least in certain embodiments, capping layer 235 may operate to promote diffusion of a dopant from dopant layer 230 into metal layer 235 to form CEM film 240. In addition, in particular embodiments, capping layer 235 may permit gases present in an annealing chamber, such as gaseous oxygen, for example, to pass from the annealing chamber, through capping layer 235, and into metal layer 220. In particular embodiments, a thickness dimension and material selection for capping layer 235 may be based, at least in part, on an ability of a capping layer material to transport gaseous oxygen present in an annealing chamber at a sufficient rate and/or within particular chosen annealing temperature ranges. Additionally, a thickness dimension and material selection for capping layer 235 may additionally depend on a type of gaseous environment within an annealing chamber. For example, an annealing chamber may be substantially filled with an oxygen-containing gaseous material, such as carbon dioxide ($CO_2$), carbon monoxide (CO), nitrosyl (NOCl), ozone ($O_3$), and so forth. Material selection for capping layer 235 may depend on additional parameters, and claimed subject matter is not limited in this respect.

Figure 4A:
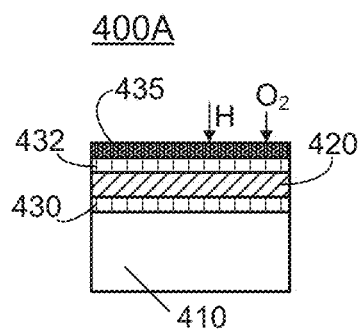
FIGS. 4A-4B illustrate first embodiments of sub-processes utilized to fabricate a switching device formed from a CEM.
Figure 4B:
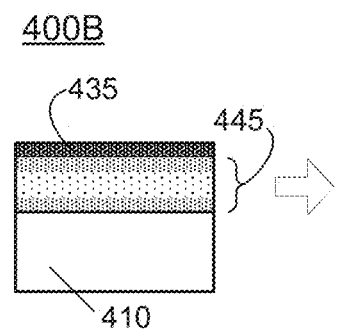

FIGS. 4A-4B illustrate first embodiments 400A and 400B of sub-processes utilized to fabricate a switching device formed from a CEM. In the embodiment of FIG. 4A, conductive substrate 410 may comprise a material similar to that of conductive substrate 210 (FIG. 2A), such as at least 90.0%, of a titanium-based and/or a titanium-containing substrate, such as titanium nitride (TiN), which may be fabricated in layers, for example. In other embodiments, conductive substrate 410 may comprise one or more other conductive materials, such as platinum, copper, and so forth, and claimed subject matter is intended to embrace all conductive substrates, virtually without limitation. After formation of conductive substrate 410, first dopant layer 430 may be formed on or over conductive substrate 410, and may comprise a thickness dimension between about 0.1 Å to about 250.0 Å, for example. A thickness dimension of first dopant layer 430 may be selected depending, at least in part, on a physical size of dopant atoms or dopant molecules, dimensions of a lattice structure formed by atoms or molecules of a dopant, a rate of diffusion of a dopant into metal layer 420, for example, ranges of annealing temperatures, and so forth, and claimed subject matter is not limited in this respect. Further, although in one particular embodiment, metal layer 420 comprises a first material having an atomic concentration of at least 90.0% nickel, claimed subject matter is intended to embrace metal layers comprising at least a substantial percentage of any other transition metal (e.g., d-block or f-block metals of the periodic table of elements).

After formation of first dopant layer 430 on conductive substrate 410, metal layer 420 may be formed on first dopant layer 430. Metal layer 420 may comprise a metal similar to that of metal layer 220 of FIG. 2B, for example, such as Ni, and may comprise a thickness dimension of between about 15.0 Å and about 1500.0 Å, for example. However, in other embodiments, metal layer 420 may comprise any transition metal, transition metal oxide, and/or any other d-block or f-block element, or alloy thereof, having an atomic concentration of at least 90.0% metal atoms. After formation of metal layer 420, a second dopant layer 432 may be deposited on metal layer 420. A second dopant layer 432 may comprise a dopant similar to a dopant of first dopant layer 430. However, in embodiments, second dopant layer 432 may comprise a dopant that differs from a dopant of first dopant layer 430, and claimed subject matter is intended to embrace all types of dopants used in the formation of dopant layer 432. After formation of dopant layer 432, capping layer 435, which may comprise materials similar to those utilized to form capping layer 235 (FIG. 3A), may be formed on or over dopant layer 432.

Figure 4C:
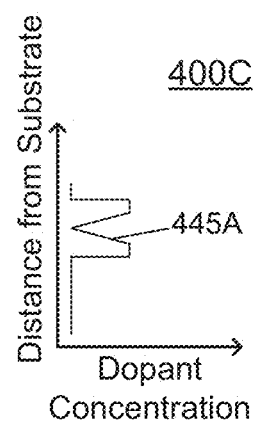
FIG. 4C illustrates a dopant concentration profile formed responsive to the sub-processes of FIGS. 4A-4B, according to an embodiment.

In the embodiment of FIG. 4B, responsive to annealing in an oxygen-containing environment (as indicated by H↓, and $O_2$↓) of metal layer 420, a dopant from first dopant layer 430 and/or second dopant layer 432 may diffuse into metal layer 420, which may form CEM layer 445. In the embodiment of FIG. 4B, CEM layer 445 may comprise one or more localized regions at which a stepped or steeply graded atomic concentration of a dopant may be present at or near a boundary of conductive substrate 410. As separation from the boundary of conductive substrate 410 increases, dopant concentration may decrease to a minimum before increasing again near a boundary CEM layer 445 with capping layer 435. As shown in FIG. 4C (embodiment 400C) a profile of atomic concentration of a dopant formed responsive to the sub-processes of FIGS. 4A-4B, according to embodiment 400C. In embodiments, dopant concentration profile 445A may be formed in response to annealing of metal layer 420 in the presence of first dopant layer 430 and second dopant layer 432. It should be noted that dopant concentration profile 445A, in which dopant concentration varies as a function of separation from conductive substrate 410, may be brought about via other mechanisms, and claimed subject matter is not limited in this respect.

Figure 5A:
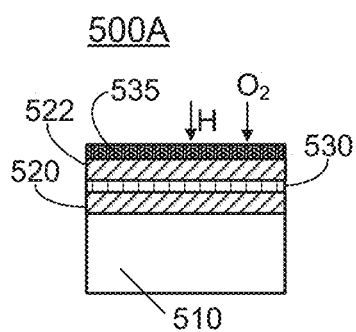
FIGS. 5A-5B illustrate second embodiments of subprocesses utilized to fabricate a switching device formed from a CEM.
Figure 5B:
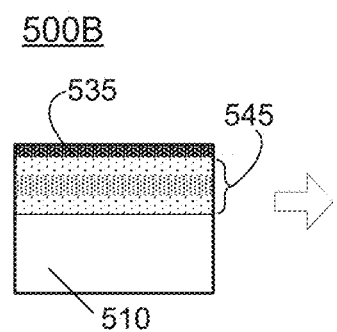

FIGS. 5A-5B illustrate embodiments 500A and 500B of subprocesses utilized to fabricate a switching device formed from a CEM. In the embodiment of FIG. 5A, conductive substrate 510 may comprise a material similar to that of conductive substrate 210 (FIG. 2A), such as at least 90.0% of a titanium-based and/or titanium-containing substrate, such as TiN, which may be fabricated in layers, for example. In other embodiments, conductive substrate 510 may comprise one or more other conductive materials, such as platinum copper and so forth, and claimed subject matter is intended to embrace all conductive substrates, virtually without limitation. After formation of conductive substrate 510, first metal layer 520, which may comprise a thickness dimension of between about 15.0 Å and about 1500.0 Å, for example, may be formed on or over conductive substrate 510. After formation of first metal layer 520, dopant layer 530 may be formed on or over first metal layer 520. In particular embodiments, dopant layer 530 may comprise carbon, for example, but may comprise other dopant materials, such as nitrosyl (NO), an isocyanide (RNC wherein R is H, $C_1$-$C_6$ alkyl or $C_6$-$C_{10}$ aryl), a phosphine ($R_3P$ wherein R is $C_1$-$C_6$ alkyl or $C_6$-$C_{10}$ aryl) for example, triphenylphosphine ($PPh_3$), an alkyne (e.g., ethyne) or phenanthroline ($C_{12}H_8N_2$), bipyridine ($C_{10}H_8N_2$), ethylenediamine ($C_2H_4(NH_2)_2$), acetonitrile ($CH_3CN$), fluoride (F), chloride (Cl), bromide (Br), cyanide (CN), sulfur (S), carbon (C), and/or other materials, and claimed subject matter is not limited in this respect. In particular embodiments, dopant layer 530 may comprise a thickness dimension of between about 0.1 Å to about 250.0 Å, for example.

In the embodiment of FIG. 5A, metal layer 522 may be formed on or over dopant layer 530. Metal layer 522 may comprise a metallic species similar or identical to that of first metal layer 520, or may comprise a different metallic species, and claimed subject matter is not limited in this respect. In this context, a "metallic species" corresponds to "d-block" elements or compounds/alloys of d-block elements, which correspond to transition metals or transition metal oxides (TMOs). Also in this context a "metallic species" additionally embraces "f-block" elements or compounds/alloys of f-block elements. It should be noted that, in this context, "transition metals" or TMOs also encompasses "f-block" elements or compounds/alloys of f-block elements as previously described herein. Additionally, metal layer 522 may comprise a thickness dimension different than the thickness dimension of metal layer 520; however, in particular embodiments, metal layer 522 may comprise a thickness dimension of between about 15.0 Å and about 1500.0 Å, although claimed subject matter is intended to embrace a wide variety of thickness dimensions, virtually without limitation.

As indicated by H↓, in FIG. 5A, metal layers 520 and 522, and dopant layer 530 may be annealed in an oxygen-containing environment to allow migration of a dopant from dopant layer 530 into metal layers 520 and 522. A chamber utilized to conduct an annealing process may be substantially filled with an gaseous oxygen-containing material (indicated by $O_2$↓), for example, but may be filled with other gases, such as carbon dioxide ($CO_2$), carbon monoxide (CO), nitrosyl (NOCl), ozone ($O_3$), and so forth. Responsive to exposure to an annealing temperature for a suitable duration, such as from about 0.5 minutes to approximately 180.0 minutes, dopant from dopant layer 530 may diffuse from dopant layer 530 into metal layers 520 and 522, thereby forming CEM layer 545. During annealing, capping layer 535, which comprise material parameters similar to those of capping layer 235 (of FIG. 3A), may reduce evaporation of a dopant from dopant layer 530. Capping layer 535 may thus operate to promote diffusion of a dopant into metal layers 520 and 522. Additionally, capping layer 535 may permit gases present in an annealing chamber, such as gaseous oxygen, for example, to pass from the annealing chamber through capping layer 535, and into metal layers 520 and 522.

Figure 5C:
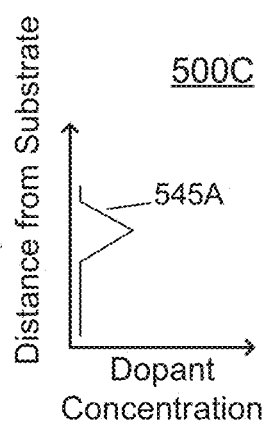
FIG. 5C illustrates a dopant concentration profile formed responsive to the sub-processes of FIGS. 5A-5B, according to an embodiment.

As shown in FIG. 5C, dopant concentration profile 545A may be formed responsive to the subprocesses of FIGS. 5A-5B, in which a dopant of dopant layer 530 may be permitted to diffuse into metal layers 520 and 522. Responsive to such diffusion, CEM layer 545 may comprise a graded atomic concentration of a dopant. Thus, as shown in FIG. 5C (embodiment 500C) dopant concentration profile 545A indicates an increasing dopant concentration as separation from conductive substrate increases. A dopant concentration of CEM layer 545 may reach a peak prior to decreasing to a minimum at a boundary of CEM layer 545 with capping layer 535. It should be noted that dopant concentration profile 545A, in which dopant concentration varies as a function of separation from conductive substrate 510, may be brought about via other mechanisms, and claimed subject matter is not limited in this respect.

Although the dopant concentration profiles 445A and 545A of FIG. 4C and FIG. 5C comprise particular contours, such as relatively linear contours, for example, in other embodiments, dopant concentration profiles may comprise curved contours, and claimed subject matter is not limited in this respect. For example, in particular embodiments, such as responsive to annealing of a metal layer in the presence of a dopant layer for relatively short durations, such as between about 0.5 minutes and about 15.0 minutes, dopant concentration profiles may indicate relatively abrupt or stepped profiles. Such abrupt or stepped profiles of dopant within localized regions of a CEM may occur responsive to relatively small quantities of a dopant thermally migrating from, for example, a dopant layer in the direction of a metal layer. In other embodiments, such as responsive to annealing of a metal layer in the presence of the dopant layer for relatively long durations, such as between about 60.0 minutes and about 180.0 minutes, dopant concentration profiles within localized regions of a CEM may indicate relatively gradual, curved contours. Such gradual or curved profiles may occur responsive to relatively substantial quantities of a dopant migrating from, for example, a dopant in the direction of a metal layer. It should be noted that claimed subject matter is intended to embrace a wide variety of dopant concentration profiles, which may occur responsive to annealing durations, annealing temperatures, thickness dimensions of metal layers and/or dopant layers, etc.

Figure 6A:
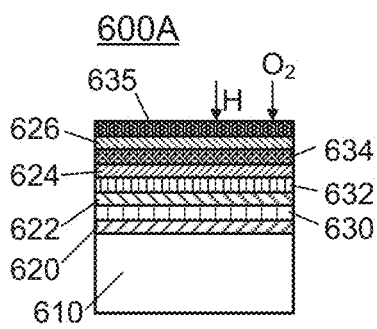
FIGS. 6A-6B illustrate third embodiments of subprocesses utilized to fabricate a switching device formed from a CEM.
Figure 6B:
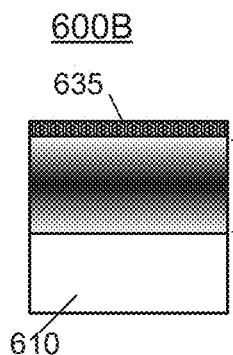

FIGS. 6A-6B illustrate third embodiments (600A and 600B) of subprocesses utilized to fabricate a switching device formed from a CEM. In the embodiment of FIG. 6A, conductive substrate 610 may comprise a material similar to that of conductive substrate 210 (FIG. 2A), such as at least 90.0% of a titanium-based and/or titanium-containing substrate, such as TiN, which may be fabricated in layers, for example. After formation of conductive substrate 510, first metal layer 620, which may comprise a thickness dimension of between about 15.0 Å and about 1500.0 Å, for example, may be formed on or over conductive substrate 610. After formation of first metal layer 620, dopant layer 630 may be formed on or over first metal layer 620. In particular embodiments, dopant layer 630 may comprise carbon, for example, but may comprise other dopant materials, such as dopant materials previously described herein, and claimed subject matter is not limited in this respect. In particular embodiments, dopant layer 530 may comprise a thickness dimension of between about 0.1 Å to about 250.0 Å, for example.

In the embodiment of FIG. 6A, metal layer 522 may be formed on or over dopant layer 630. Metal layer 622 may comprise a metallic species similar or identical to that of first metal layer 620, or may comprise a different metallic species than metal layer 620, and claimed subject matter is not limited in this respect. Additionally, metal layer 622 may comprise a thickness dimension different than the thickness dimension of metal layer 620; however, in particular embodiments, metal layer 622 may comprise a thickness dimension of between about 15.0 Å and about 1500.0 Å, although claimed subject matter is intended to embrace a wide variety of thickness dimensions, virtually without limitation.

As shown in FIG. 6A, additional dopant layers, such as dopant layers 632 and 634, for example, may be interleaved between metal layers, such as 622, 624, and 626. It should be noted that although four metal layers are shown as deposited on or over and adjacent dopant layer, claimed subject matter is intended to embrace any number of metal layers and dopant layers interleaved between metal layers. In addition, metal layers 622, 624, and 626 may comprise differing metal species, or similar metal species, and claimed subject matter is not limited in this respect. For example, in one embodiment metal layers 622, 624, at 626 may comprise nickel; however, in another embodiment, metal layer 622 may comprise nickel and metal layer 622 may comprise titanium, just to name an example. Further, relative positions of metal layers and dopant layers may be rearranged into alternate configurations. Thus, although the embodiment of FIG. 6A shows a metal layer deposited on substrate 610, to be followed by a dopant layer (e.g., metal/dopant/metal/dopant/metal, etc.) in other embodiments, a dopant layer may be deposited on substrate 610, followed by a metal layer (e.g., dopant/metal/dopant/metal/dopant, etc.). Further, intervening dopant layers may comprise varying thickness dimensions. Thus, a first dopant layer may comprise a thickness dimension of, for example, between about 0.1 Å to about 10.0 Å, for example, while a second dopant layer may comprise a thickness dimension of, for example, between about 15.0 Å and about 20.0 Å.

In the embodiment of FIG. 6A, capping layer 635, which may comprise material parameters similar to those of capping layer 235 of FIG. 3A, may operate to reduce evaporation of dopant from dopant layers 630, 632, and 634 during annealing of the structure of FIG. 6A. Responsive to annealing of the structure of FIG. 6A, dopant from dopant layers 630, 632, and 634 may diffuse into metal layers 620, 622, 624, and 626, thus forming CEM layer 640, of FIG. 6B.

Figure 6C:
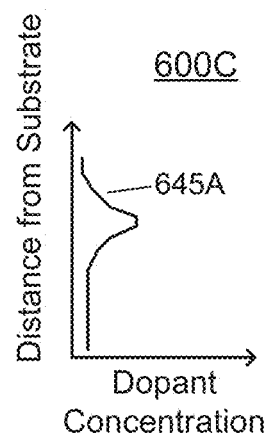
FIG. 6C illustrates a dopant concentration profile formed responsive to the sub-processes of FIGS. 6A-6B, according to an embodiment.

FIG. 6C illustrates a dopant concentration profile responsive to the sub-processes of dopant concentration profile 645A indicates an increasing dopant concentration as separation from conductive substrate 610 increases. A dopant concentration of CEM layer 645 may reach a peak prior to decreasing to a minimum at a boundary of CEM layer 645 with capping layer 635. It should be noted that dopant concentration profile 645A, in which dopant concentration varies as a function of separation from conductive substrate 510, may be brought about via other mechanisms, and claimed subject matter is not limited in this respect. It should also be noted that depending on arrangement of dopant layers and metal layers of a structure, such as a structure similar to that of FIG. 6A, a wide variety of dopant concentration profiles may be achieved, and claimed subject matter is not limited in this respect. In particular embodiments, CEM layer 645 comprises at least first and second localized regions, wherein the first localized region comprises an atomic concentration of a dopant, such as carbon, that is at least 20% higher than the atomic concentration of the dopant (e.g., carbon) at the second localized region. However, a dopant concentration profile may indicate numerous localized regions of particular atomic concentrations, or ranges of atomic concentrations, for example, based, at least in part, on a number of dopant layers, such as dopant layers 630, 632, and 634, present in a CEM device.

FIGS. 7A-7D illustrate embodiments of a sub-process to form a multi-layer CEM device. In embodiment 700A (FIG. 7A), substrate 710 may comprise a material similar to that of substrate 210 (FIG. 2A), such as a substrate comprising at least 90.0% of a titanium-based and/or titanium-containing substrate, such as titanium nitride, which may be fabricated in layers. In other embodiments, conductive substrate 710 may comprise one or more other conductive materials, such as platinum, copper, and so forth, and claimed subject matter is intended to embrace all conductive substrates, virtually without limitation. After formation of substrate 710, a first insulative layer 750 may be deposited on or over conductive substrate 710. First insulative layer 750 may comprise a material such as silicon nitride ($Si_3N_4$), which may function to electrically insulate first metal layer 720 from substrate 710. In this context, and insulative material, such as insulative layer 750, is defined as a material that conducts only negligible current. In addition, an insulative material additionally comprises a material selected so as to be substantially unreactive with metallic species, such as first metal layer 720. Thus, in the embodiment of FIG. 7A, alternating insulative layers, such as insulative layer 750, and metal layers, such as metal layers 720 may be deposited on or over conductive substrate 710. Although FIG. 7 a illustrates three of metal layers 720 interleaved with insulative layers 750, claimed subject matter is intended to embrace any number of metal layers interleaved with insulative layers, virtually without limitation.

In embodiment 700B (FIG. 7B) void 760 may be formed or etched into the multi-layer CEM device. In this context, a "void" as the term is used herein, means a cavity or hole, or other absence of material, such as an absence of material in a structure, which may comprise a substrate. According to embodiments, a hole or a void may be formed, for example, by way of an etching process or a patterning process, which may include use of a photoresist mask, for example. It should be understood, however, that this is merely an example of an approach toward forming a hole or a void, and claimed subject matter is not limited in this respect. In embodiments, voids, such as void 760, for example, may be etched responsive to use of a masking material (e.g., photoresist), which may be followed by a patterning operation and etching. In embodiments, a photoresist process may be supplemented utilizing a hard mask material, which may etch at a decreased rate relative to a photoresist process. In particular embodiments, use of a photoresist material may provide a pattern in a hard mask in which the hard mask may be utilized to mask off one or more areas of a surface of a multi-level structure within which etching is not desired. In certain embodiments, an etching process may comprise a dry etch or a wet etch, for example, or may involve reactive ion/plasma in a manner that accords with high-aspect ratio etching of dynamic random access memory, for example, or may utilize an etching processes that accord with an etching processes utilized in fabrication of three-dimensional NAND flash memory. It should be noted that embodiment 700B may utilize other processes to give rise to formation of void 760 and claimed subject matter is not limited in this respect.

Figure 7A:
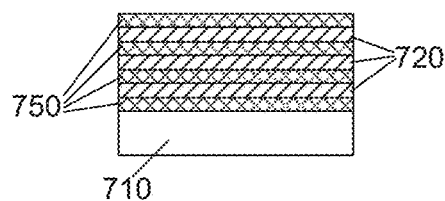
FIGS. 7A-7E illustrate an embodiment of a sub-process to form a multi-layer CEM device.
Figure 7B:
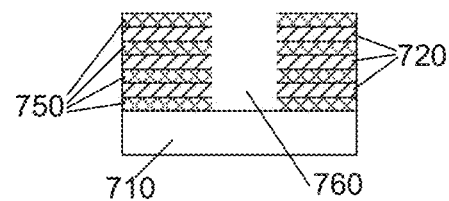
Figure 7C:
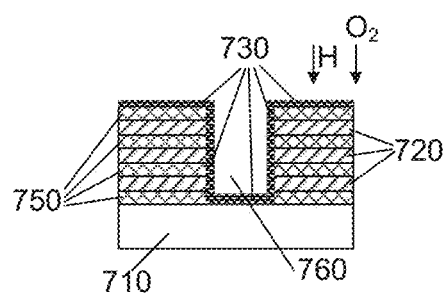

In embodiment 700C (FIG. 7C) void 760 may be formed or etched into the multi-layer CEM device. Dopant layer 730 may be deposited over the multi-layer CEM device. In embodiments, deposition may include coating or covering inner surfaces of void 760 with dopant layer 730. In particular embodiments, dopant layer 730 may comprise carbon, for example, but may comprise other dopant materials, such as dopant materials previously described herein, and claimed subject matter is not limited in this respect. In particular embodiments, dopant layer 730 may comprise a thickness dimension of between about 0.1 Å to about 250.0 Å, for example. As shown in FIG. 7C, the multi-layer CEM device may be exposed to an annealing temperature (as indicated H↓) in an oxygen environment (as indicated by $O_2\downarrow$). In particular embodiments, an annealing temperature may comprise a temperature of between about 100.0° C. to about 450.0° C., although claimed subject matter is intended to embrace any annealing temperatures, virtually without limitation. In certain embodiments, the multi-layer CEM device of FIG. 7C may be exposed to annealing temperatures for the duration of between about 15.0 seconds (such as may be utilized during Rapid Thermal Anneal) up to about 60.0 minutes, for example.

Figure 7D:
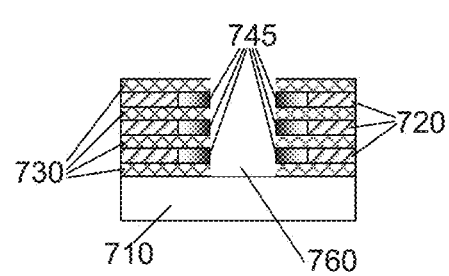
Figure 7E:
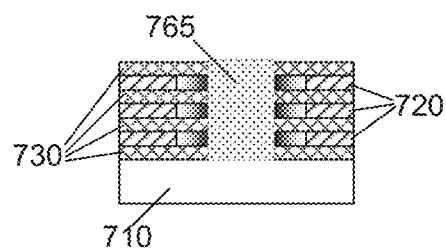

In embodiment 700D (FIG. 7D), responsive to exposure of the multi-layer CEM device to an annealing temperature, a dopant from a dopant layer 730 may diffuse into at least localized portions of metal layer 720 to form localized CEM films 745. In the embodiment of FIG. 7D, localized CEM film may comprise a carbon-doped CEM, but may comprise a CEM film doped with any other suitable dopant type, such as nitrogen, for example, or other dopants described herein, and claimed subject matter is not limited in this respect. In particular embodiments, a thickness dimension of dopant layer 730 may be increased to allow an increased amount of dopant to diffuse into metal layers 720. In certain embodiments, increased diffusion of a dopant into metal layers 720 may also be brought about via extending annealing duration and/or increasing annealing temperature, for example.

In embodiment 700E (FIG. 7E) electrode 765 may be formed within void 760 to be in contact with localized CEM films 745. In particular embodiments, electrode 765 comprise TiN, which may be fabricated in layers. In other embodiments, electrode 765 may comprise d-block or f-block materials other than titanium, such as platinum, copper, aluminum, cobalt, nickel, tungsten, tungsten nitride, cobalt silicide, ruthenium, ruthenium oxide, chromium, gold, palladium, indium tin oxide, tantalum, tantalum nitride, silver, iridium, or iridium oxide or alloys thereof, and claimed subject matter is not limited to any particular composition of electrode 765. In a particular embodiment, electrode 765 may comprise a wordline, for example, wherein a common source voltage coupled to electrode 765 may provide electrical current to localized CEM films 745.

FIGS. 8 and 9 are flow diagrams illustrating processes of fabricating and/or constructing a CEM switching device according to an embodiment 800. Example implementations, such as described in FIGS. 8-9, may include blocks in addition to those shown and described, fewer blocks, or blocks occurring in an order different than may be identified, or any combination thereof. The method of FIG. 8 may begin at block 810, which may comprise depositing, in a chamber, one or more layers of the first material having an atomic concentration of a first transition metal of at least about 90.0%, over a conductive substrate. The method may continue at block 820, which may comprise depositing one or more layers of a second material, comprising an atomic concentration of carbon of at least 90.0%, over the one or more layers of the first material. The method may continue at block 830, which may comprise annealing the one or more layers of the second material deposited over the one or more layers of the first material, in an oxygen-containing environment, wherein the annealing operates to diffuse carbon and oxygen into the one or more layers of the first material to form a first CEM. In particular embodiments, the first material may comprise an atomic concentration of at least 90.0% of a transition metal. The method may continue at block 820, which may comprise depositing one or more first layers of a dopant, such as carbon, on the conductive material deposited at block 810. In certain embodiments, the deposited first layers of a dopant may comprise dopant materials other than carbon such as nitrogen, for example.

The method may continue at block 830, in which the one or more first layers of a dopant formed on the one or more layers of the first transition metal are annealed in an oxygen-containing environment. At block 830, the annealing may operate to diffuse carbon and oxygen into the one or more layers of the first transition metal, which may form a first CEM.

In particular embodiments, the first CEM formed at block 830 may comprise an atomic concentration of between about 0.1% and about 15.0% of carbon. In addition, annealing, such as annealing at block 830, may be performed in an oxygen-containing environment the S substantially filling the chamber with carbon dioxide, carbon monoxide, oxygen, ozone or nitrosyl, or any combination thereof. In a particular embodiment, prior to annealing, such as at block 820, a capping layer may be deposited over the one or more layers of the second material, which may operate to confine, during the annealing, the second material to within the one or more layers of the first material. In a particular embodiment, the annealing performed at block 830 may comprise exposing the one or more layers of the second material deposited over the one or more layers of the first material, to an ambient temperature of between about 350.0° C. and about 450.0° C.

In an embodiment, the method of FIG. 8 may further comprise etching one or more voids into the one or more layers of the first material prior to depositing the one or more layers of the second material over the one or more layers of the first material. The method of FIG. 8 may further comprise depositing, prior to the annealing of block 830, one or more layers of a third material comprising an atomic concentration of a second transition metal of at least 90.0% over the conductive substrate. The method may further comprise depositing, prior to the annealing, one or more layers of a material comprising an atomic concentration of carbon over the one or more layers of the third material. The method may further comprise diffusing, via the annealing, carbon and oxygen into the one or more layers of the third material to form a second CEM having an atomic concentration of between 0.1% and about 15.0% of carbon. In the embodiment of FIG. 8, the second CEM may correspond to a localized region, wherein the localized region comprises an atomic concentration of carbon that is at least 20.0% greater than the atomic concentration of carbon at a localized region corresponding to the first CEM. In particular embodiments, the first transition metal of the one or more layers of the first material may comprise the same metallic species as the second transition metal of the one or more layers of the third material. However, in other embodiments, the first transition metal of the one or more layers of the first material may comprise a different metallic species as the second transition metal of the one or more layers of the third material.

FIG. 9 is a flow diagram illustrating processes of fabricating and/or constructing a CEM switching device according to an embodiment 900. The method of FIG. 9 may begin at block 910, which may comprise depositing, in a chamber, one or more layers of a first material, having an atomic concentration of a first transition metal of at least about 90.0%, over a conductive substrate. The method of FIG. 9 may continue at block 920, which may comprise forming one or more voids in the one or more layers of the first material. At block 920, forming one or more voids may comprise etching the one or more layers of the first material to form the one or more voids. The method may continue at block 930, which may comprise depositing one or more layers of the second material, having an atomic concentration of carbon of at least about 90.0%, on the one or more layers of the first material. At block 940, the method may continue with annealing the one or more layers of the second material, deposited on the one or more layers of the first material, in an oxygen-containing environment, wherein the annealing operates to diffuse carbon and oxygen into the one or more layers of the first material to form a CEM. In particular embodiments, an oxygen-containing environment may comprise a chamber or other environment filled with carbon dioxide, carbon monoxide, oxygen, ozone, nitrosyl, nitrous oxide or nitric oxide, or combinations thereof. Annealing may comprise exposing the one or more layers of the second material deposited on the one or more layers of the first material to a temperature of between about 350.0° C. and about 450.0° C.

In particular embodiments, prior to forming one or more voids, such as at block 920, the method may additionally comprise depositing an insulative material on the one or more layers of the first material and depositing one or more layers of the third material, comprising an atomic concentration of a second transition metal of at least 90.0%, over the insulative material. In certain embodiments, the CEM formed at block 940 may comprise an atomic concentration of carbon of between about 0.1% to about 15.0%. The method of FIG. 9 may additionally comprise evaporating access carbon from a surface of the CEM after the annealing of the one or more layers of the second material deposited on the one or more layers of the first material. The method of FIG. 9 may additionally comprise depositing a capping layer over the one or more layers of the second material, prior to the annealing to bring about inhibiting of evaporation of the second material from the one or more layers of the first material.

A plurality of CEM devices, such as those described herein, may be formed to bring about integrated circuit devices, which may include, for example, a first correlated electron device having a first correlated electron material and a second correlated electron device having a second correlated electron material, wherein the first and second correlated electron materials may comprise substantially dissimilar impedance characteristics that differ from one another. Also, in an embodiment, a first CEM device and a second CEM device, comprising impedance characteristics that differ from one another, may be formed within a particular level of an integrated circuit. Further, in an embodiment, forming the first and second CEM devices within a particular level of an integrated circuit may include forming the CEM devices at least in part by selective epitaxial deposition. In another embodiment, the first and second CEM devices within a particular level of the integrated circuit may be formed at least in part by ion implantation, such as to alter impedance characteristics for the first and/or second CEM devices, for example.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method of constructing a switching device, comprising:
    depositing in a chamber one or more layers of a first material over a conductive substrate;
    depositing one or more layers of a second material having an atomic concentration of metal atoms over the one or more layers of the first material;
    depositing one or more layers of a third material over the one or more layers of the second material; and
    annealing the one or more layers of the first material, the one or more layers of the second material and the one or more layers of the third material to diffuse one or more dopants from the one or more layers of the first material and the one or more layers of the third material into the one or more layers of the second material to form a first correlated electron material (CEM) and to impart a particular distribution of an atomic concentration of the one or more dopants within the one or more layers of the second material to provide a switching capability.

2. The method of claim 1, wherein the one or more layers of the first material or the one or more layers of the third material, or a combination thereof, are deposited to respective particular thicknesses selected to impart the particular distribution of the atomic concentration of the one or more dopants in the one or more layers of the second material from the annealing.

3. The method of claim 2, wherein the particular distribution of the atomic concentration of the one or more dopants in the one or more layers of the second material imparted from the annealing varies at least in part as a function of separation from the conductive substrate.

4. The method of claim 2, wherein the particular distribution of the atomic concentration of the one or more dopants in the one or more layers of the second material decreases with an increase in distance from the conductive substrate.

5. The method of claim 1, further comprising forming a capping layer over the one or more layers of the third material;
    wherein the particular distribution of the atomic concentration of the one or more dopants in the one or more layers of the second material decreases with an increase in separation from the conductive substrate until a reduced concentration is imparted at a particular location within the one or more layers of the second material, and wherein the particular distribution of the atomic concentration of the one or more dopants in the one or more layers of the second material increases from the reduced concentration imparted at the particular location within the one or more layers of the second material with a decrease in separation from the particular location to the capping layer.

6. The method of claim 1, wherein the conductive substrate comprises an atomic concentration of at least 90.0% of titanium.

7. The method of claim 1, wherein the depositing the one or more layers of the first material comprises depositing the one or more layers of the first material to a thickness of 0.1 Å to 250.0 Å.

8. The method of claim 7, wherein the first material comprises an atomic concentration of at least 90.0% of nickel.

9. The method of claim 1, wherein the depositing the one or more layers of the second material comprises depositing the one or more layers of the second material to a thickness of 15.0 Å to 1500.0 Å.

10. The method of claim 1, wherein the second material comprises a metal, metal oxide or metal compound, or a combination thereof.

11. The method of claim 1, wherein the second material comprises an atomic concentration of at least about 90.0% of nickel.

12. The method of claim 1, wherein the third material comprises a similar material to the first material.

13. The method of claim 1, wherein the third material comprises a different material from the first material.

14. The method of claim 1, wherein the annealing the one or more first layers of the first material, the one or more layers of the second material and the one or more layers of the third material comprises annealing the one or more layers of the first material, the one or more layers of the second material and the one or more layers of the third material in an oxygen-containing environment.

15. The method of claim 14, further comprising forming the oxygen-containing environment via substantially filling the chamber with carbon dioxide ($CO_2$), carbon monoxide (CO), oxygen ($O_2$), ozone ($O_3^+$) or nitrosyl (NO), or any combination thereof.

16. A switching device, comprising: a structure comprising:
- a conductive substrate; and
- one or more layers of a first material positioned over the conductive substrate; and
- a capping layer positioned over the one or more layers of the first material;
- wherein the atomic concentration of a dopant in the one or more layers of the first material to increase with an increase in separation from the conductive substrate to a particular location within the one or more layers of the first material, and wherein the atomic concentration of the dopant in the one or more layers of the first material to decrease from the particular location within the one or more layers of the first material with a decrease in separation from the particular location to the capping layer.

* * * * *